United States Patent
Schmidt et al.

(10) Patent No.: US 10,499,531 B2
(45) Date of Patent: Dec. 3, 2019

(54) RACK LEVEL NETWORK SWITCH

(71) Applicant: SCHNEIDER ELECTRIC IT CORPORATION, West Kingston, RI (US)

(72) Inventors: Michael Kenneth Schmidt, St. Charles, MO (US); Daniel J. Rohr, Wildwood, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 0 days.

(21) Appl. No.: 15/956,264

(22) Filed: Apr. 18, 2018

(65) Prior Publication Data

US 2019/0327851 A1    Oct. 24, 2019

(51) Int. Cl.
| | | |
|---|---|---|
| *H02B 1/20* | (2006.01) | |
| *H05K 7/14* | (2006.01) | |
| *G06F 1/28* | (2006.01) | |
| *H05K 7/18* | (2006.01) | |

(52) U.S. Cl.
CPC ............ *H05K 7/1492* (2013.01); *G06F 1/28* (2013.01); *H05K 7/18* (2013.01)

(58) Field of Classification Search
CPC .......... H05K 7/1492; H05K 7/18; G06F 1/28
USPC ....................................................... 361/826
See application file for complete search history.

(56) References Cited

U.S. PATENT DOCUMENTS

| | | | |
|---|---|---|---|
| 7,542,268 B2* | 6/2009 | Johnson, Jr. ......... | H05K 7/1492 174/50 |
| 8,723,653 B2 | 5/2014 | Jansma | |
| 8,880,907 B2 | 11/2014 | Ives et al. | |
| 9,141,154 B2* | 9/2015 | Champion ............. | G06F 1/189 |
| 9,143,007 B2* | 9/2015 | Wu ...................... | H02J 13/0082 |
| 2006/0116023 A1 | 6/2006 | Spitaels et al. | |
| 2006/0139855 A1* | 6/2006 | Ewing .................. | H05K 7/1492 361/600 |
| 2007/0099493 A1* | 5/2007 | Niazi .................... | H01R 13/518 439/540.1 |
| 2008/0093927 A1* | 4/2008 | Ewing .................. | H05K 7/1492 307/23 |

(Continued)

OTHER PUBLICATIONS

Tripp Lite Owner's Manual, "Rackmount Managed Network Switch with Built-in PDU and isobar® Surge Protection," Models: NSS-G16D2, NSS-G24D2 [Series No. AG-014D], copyright ©, May 18, 2016, pp. 24; retrieved: https://www.tripplite.com/support/owners-manual/753603.

(Continued)

*Primary Examiner* — Hung S. Bui
(74) *Attorney, Agent, or Firm* — Lando & Anastasi, LLP

(57) ABSTRACT

Systems and methods of providing network connectivity to an equipment rack are provided. A network switch includes an enclosure to be aligned along the height of an equipment rack. The network switch provides a plurality of network ports distributed along the enclosure so the network ports are associated with mounting spaces in the rack, when installed. A controller provides communications between the plurality of network ports and may be configured to identify installed equipment in particular rack spaces, from network traffic on particular network ports and by association of the network ports with the rack spaces.

21 Claims, 8 Drawing Sheets

(56) References Cited

U.S. PATENT DOCUMENTS

| | | | |
|---|---|---|---|
| 2008/0244281 A1* | 10/2008 | Felter | G06F 1/28 |
| | | | 713/300 |
| 2012/0185590 A1 | 7/2012 | Kolin et al. | |
| 2016/0095247 A1* | 3/2016 | Rohr | H05K 7/1498 |
| | | | 362/382 |
| 2016/0224046 A1* | 8/2016 | Hsieh | G05F 1/66 |
| 2017/0257970 A1 | 9/2017 | Alleman et al. | |
| 2017/0315950 A1 | 11/2017 | Whitney | |

OTHER PUBLICATIONS

Extended European Search Report from corresponding European Application No. 19169955.2 dated Sep. 5, 2019.

* cited by examiner

RACK LEVEL NETWORK SWITCH

BACKGROUND OF INVENTION

Field of the Invention

At least one example in accordance with the present invention relates generally to providing network communication connectivity to rack-mounted equipment.

Discussion of Related Art

Equipment racks in data centers provide structural support for various equipment, such as data servers, storage systems, and the like. In some cases, power distribution, environmental control, and network communications capabilities may be integrated with, installed in, or otherwise made available at an equipment rack. Conventional network equipment is mounted in the rack, takes up one or more spaces in the rack, require various length data cables to reach various other equipment in the rack, and provide little or no integration with power distribution capabilities.

SUMMARY

Aspects and embodiments are generally directed to communication network switches having an advantageous form factor for physical integration at the rack level. Examples of the aspects and embodiments discussed herein provide one or more network ports associated with particular positions within the rack (e.g., a rack U space), and may include further integration with power distribution such that data center management systems may readily or automatically identify power outlets utilized by particular equipment in the rack.

According to one aspect, a communication network switch is provided. The communication network switch includes an elongated enclosure physically configured to be aligned along the height of an equipment rack, a plurality of network ports distributed along a length of the enclosure such that each of the network ports is substantially physically associated with at least one of a plurality of mounting spaces within the equipment rack when the enclosure is installed to the equipment rack, and a controller coupled to the plurality of network ports and configured to provide communications between the plurality of network ports.

Some embodiments may include one or more uplink ports, and the controller may be further configured to provide communications between the plurality of network ports and the uplink ports. In certain embodiments, the controller may be further configured to detect an identifier of a piece of equipment connected to an identified one of the plurality of network ports and to communicate the identifier to a remote system via the one or more uplink ports.

Some embodiments may include a plurality of power outlets distributed along the length of the enclosure such that each of the plurality of network ports is substantially physically associated with at least one of the plurality of power outlets. In certain embodiments, the controller may be further configured to identify a piece of equipment connected to an identified one of the plurality of network ports and to associate at least one of the plurality of power outlets to the piece of equipment based upon the physical association of the at least one of the plurality of power outlets with the identified network port.

Certain embodiments may include a plurality of power outlets distributed along the length of the enclosure such that each of the power outlets is substantially physically associated with at least one of the plurality of mounting spaces.

Various embodiments include the equipment rack.

According to another aspect, a communication network switch is provided that includes a plurality of network ports, a plurality of power connections, each of the plurality of power connections logically associated with at least one of the plurality of network ports, and a controller coupled to the plurality of network ports and configured to provide communications between the plurality of network ports.

In some embodiments, the controller may be further configured to identify a piece of equipment connected to at least one of the plurality of network ports based upon network traffic on the at least one of the plurality of network ports. In certain embodiments, the controller is further configured to identify at least one of the plurality of power connections as providing power to the piece of equipment based upon the logical association of each of the plurality of power connections with the at least one of the plurality of network ports.

In certain embodiments, each of the plurality of network ports is physically associated with at least one of the plurality of power connections.

Various embodiments include a chassis physically configured to substantially align along a height of an equipment rack. The plurality of network ports may be distributed along the chassis such that each of the network ports is substantially physically associated with at least one of a plurality of mounting spaces within the equipment rack when the enclosure is installed to the equipment rack. In certain embodiments, the controller is further configured to identify a piece of equipment connected to at least one of the plurality of network ports based upon network traffic on the at least one of the plurality of network ports and to identify at least one of the plurality of mounting spaces as being associated with the piece of equipment based upon the physical association of the at least one of the plurality of mounting spaces with the at least one of the plurality of network ports.

According to another aspect, a method of managing equipment mounted in a rack is provided. The method includes detecting network activity on a network port, identifying the equipment from the network activity, associating the equipment with the network port, and associating the equipment with at least one of a rack space and a power outlet based upon an affiliation of the at least one rack space or power outlet with the network port.

In some embodiments the method may include communicating to a remote device an identifier of the equipment, the network port, and the at least one rack space or power outlet.

Some embodiments include identifying an associated power outlet based upon an affiliation of the associated power outlet with the network port and detecting an amount of power provided via the associated power outlet. Certain embodiments include determining an expected power consumption of the equipment based upon the identification of the equipment, and may include detecting a potential wiring fault based upon a comparison of the expected power consumption to the detected amount of power.

Certain embodiments include identifying an associated rack space based upon an affiliation of the associated rack space with the network port and populating a database to indicate that the equipment is installed in the associated rack space.

Still other aspects, embodiments, examples, and advantages of these exemplary aspects and embodiments are discussed in detail below. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example.

BRIEF DESCRIPTION OF DRAWINGS

Various aspects of at least one embodiment are discussed below with reference to the accompanying drawings, which are not intended to be drawn to scale. The drawings are included to provide illustration and a further understanding of the various aspects and embodiments, and are incorporated in and constitute a part of this specification, but are not intended as a definition of the limits of the disclosure. In the drawings, each identical or nearly identical component that is illustrated in various figures may be represented by a like numeral. For purposes of clarity, not every component may be labeled in every drawing. In the drawings.

DETAILED DESCRIPTION

Figure 1:
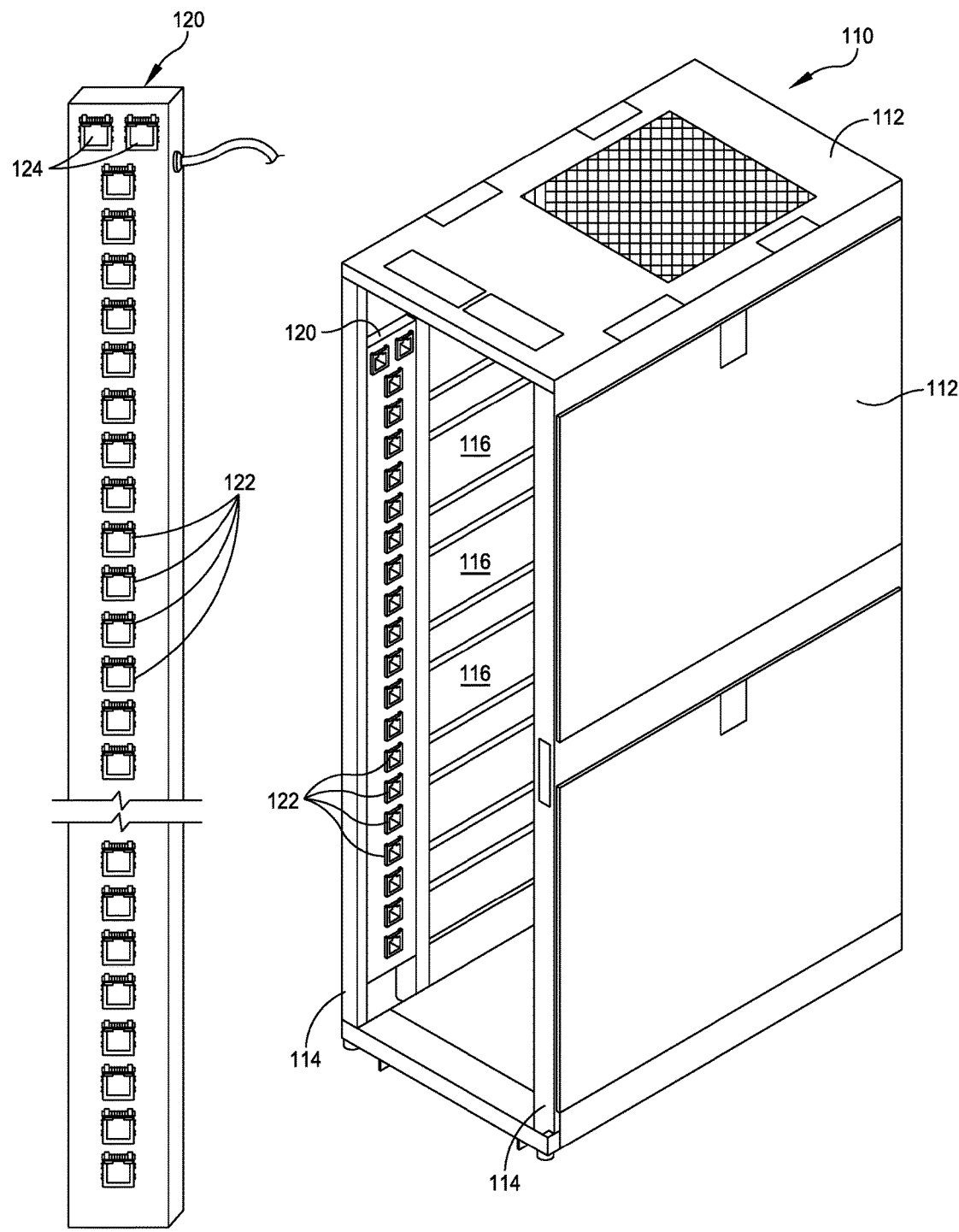
FIG. 1 is a schematic diagram of a rack level network switch in accord with at least one embodiment, shown in relation to an equipment rack.

Systems and methods discussed herein are directed to network switches configured to provide network connectivity to various equipment within a rack. The network switches are configured to affiliate each network port with either of a physical space in the rack, or a power outlet, or both. The network switches may affiliate the network ports with rack spaces and/or power outlets through a physical affiliation, e.g., proximity of each network port within the chassis/enclosure of the switch to the rack space and/or power outlet. The power outlet(s) may be provided in the same chassis/enclosure as the network ports, in some embodiments. Physical proximity of network ports, power outlets, and rack spaces facilitates ease of installation, reduces cost of varying cables, and reduces the risk of mis-connection of equipment, thus also reducing cost. The network switches may also affiliate network ports with rack spaces and/or power outlets through a logical affiliation, such as may be maintained in the memory of a controller, console, or management system, for example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. In addition, in the event of inconsistent usages of terms between this document and documents incorporated herein by reference, the term usage in the incorporated references is supplementary to that of this document; for irreconcilable inconsistencies, the term usage in this document controls.

FIG. 1 is an illustration of an equipment rack 110 and a network switch 120 in accord with at least one embodiment. The equipment rack 110 may include a frame 112 and mounting rails 114 that define a number of rack spaces 116 (e.g., rack U spaces), each of which may accommodate a piece of equipment. In various examples, rack-mounted equipment may take up one or more spaces 116. In some examples, equipment may take up less than one space 116, such as by being half-width or half-height of a space 116. Examples of such equipment include servers, data storage gear, network communications equipment, power supply equipment, environmental control equipment, user interface equipment such as keyboards and video displays, and the like. Many of these example pieces of equipment may be network enabled, capable of being connected to a network for the purpose of management of the equipment, or as the primary function of the equipment, or both. For example, a web server may have one or more network interfaces (e.g., network ports, network connectors), to accommodate its primary function out to an internet and also to allow management of the web server. In some examples, the equipment may have one or more network ports for out-of-band (OOB) management and also may have one or more network ports for primary and/or redundant user data connectivity. Other equipment may be network enabled for management purposes only. For example, a cooling component may provide cooling to the rack and be network enabled for monitoring and/or control of the cooling component.

Accordingly, various equipment installed in the rack may be network enabled. The example network switch 120 includes network ports 122 that provide network connectivity to various equipment in the rack. The network switch 120 is physically configured to be mounted vertically, along the vertical length of the rack 110, and substantially, though not necessarily, the full height of the rack 110. In various embodiments, the network switch 120 may have a top-down or a bottom-up orientation, for numbering of network ports 122 and/or location of power supply cordage (and/or network uplink ports 124, if included). In at least one embodiment, the network switch 120 is configured to be mounted in the back of an equipment rack. The network switch 120 does not require any of the spaces 116 for its physical accommodation, and may be mountable on a rear portion of the rack 110. In some embodiments, the network switch 120 may be physically configured to be accommodated in a rear vertical channel of the rack 110, alongside power distribution equipment, and/or integrated with vertically oriented power distribution equipment, which also may be top-down or bottom-up oriented, e.g., for electrical power outlet numbering.

As illustrated in FIG. 1, each of the network ports 122 is associated with a space 116 in the rack 110. In the embodiment shown in FIG. 1, two of the network ports 122 are associated with a single space 116 in the rack 110. In other embodiments, a single network port 122 or more network ports 122 may be associated with a single space 116. Further to the example network switch 120 illustrated in FIG. 1, not necessarily all the spaces 116 have a network port 122 associated therewith. In other embodiments, however, every space of a rack may have a network port associated therewith. Accordingly, in various embodiments, each of a plurality of network ports (e.g., network ports 122) is associated with one space of a rack (e.g., space 116).

Various advantages are provided by the example network switch 120. For example, each of the network ports 122 are substantially consistently placed, physically, relative to the rack space 116 it serves. Accordingly, network data cables from each network port 122 to a piece of equipment mounted in a respective space 116 may be of a consistent and minimal length, thereby reducing cabling costs, simplifying cable purchasing and inventory, and reducing the need for complex cable management, e.g., reduced need to route long cables through the rack. Further advantage is had in that each of the plurality of network ports 122 is associated with a particular space 116, such that each of the plurality of network ports may be associated with a particular piece of equipment, based upon the known relationship of the network ports to a space in the rack. Such a relationship between network ports and equipment may be discoverable in an automated fashion, without manual data entry. In various embodiments, the network switch 120 may include a controller (e.g., a network processor, or a computing system) that identifies various communication layers associated with equipment connected to the network switch 120. For example, a controller (as part of the network switch 120) may identify the physical layer network port 122 and associate with it a data link layer identifier, such as a media access control (MAC) identifier, of the piece of equipment plugged in to the particular network port 122. Further, the controller may associate a network layer identifier, such as an Internet Protocol (IP) address, with the particular network port 122. In some embodiments, the controller may communicate an identifier of the network port 122 to a higher level network management or data center management system, and the higher level system may form the association of each of various network ports 122 to data link, network layer, or other identifiers of the equipment connected to the various network ports 122. In some embodiments, the controller of the network switch 120 may perform the network switching function of the network switch 120, e.g., switching and/or routing of protocol datagram units (e.g., cells, frames, packets, etc.) affiliated with any of various network types. In other embodiments, the controller may be separate from the core network switching function.

A further advantage, in some embodiments, includes associating equipment installed in the rack with a particular one of multiple power outlets. For example, while the network switch 120 provides a direct association between a network port 122 and a rack space 116, a power distribution unit (PDU) may provide a direct association between a power outlet (or connection) and a space 116 in the rack 110. Accordingly, a piece of equipment installed in any space 116 is network discoverable by, e.g., the network switch 120 identifying the equipment from its network traffic, associating the equipment identifier with the network port 122 to which it is connected (e.g., the network port 122 on which its network traffic is received), associating the equipment to the rack space 116 served by the network port 122, and associating the equipment to a power outlet that serves the rack space 116 (or is affiliated with the particular network port 122).

The network switch 120 may also include uplink ports 124 to provide network connectivity to a higher level, e.g., a router or other equipment serving a communication network beyond the rack 110. For example, equipment in the rack 110 may communicate with each other or with equipment outside of the rack 110. When a piece of equipment in the rack 110 transmits a datagram (frame, packet) through a network interface, the network switch 120 receives the datagram at the associated network port 122 and switches (or routes, in some embodiments) the datagram from the associated network port 122 to one of another network port 122 or to one of the uplink ports 124, whichever is appropriate for the destination of the datagram. Switching and routing of network frames and packets is known in the art, and is accordingly not described in further detail herein.

In certain embodiments, the network ports 122 may physically conform to a registered jack (RJ) convention, such as an RJ-45 connector having 8 conductor positions, as known in the art, and may support various Ethernet or IEEE 802.x or similar protocols. In various embodiments, the network ports 122 may be any suitable physical structure to support, e.g., copper or fiber connections, and may support any suitable communications protocol to accommodate various applications.

Various embodiments may include two uplink ports 124 as shown in FIG. 1, or may include more or fewer uplink ports, or no uplink port. In various embodiments, uplink ports 124 may be of higher bit rate than network ports 122. In various embodiments, uplink ports 124 may support copper or fiber connections, such as via an RJ-45 electrical connector or a small form-factor pluggable (SFP) optical connector, and may support any of various communications protocols to accommodate various installations and applications.

Figure 2:
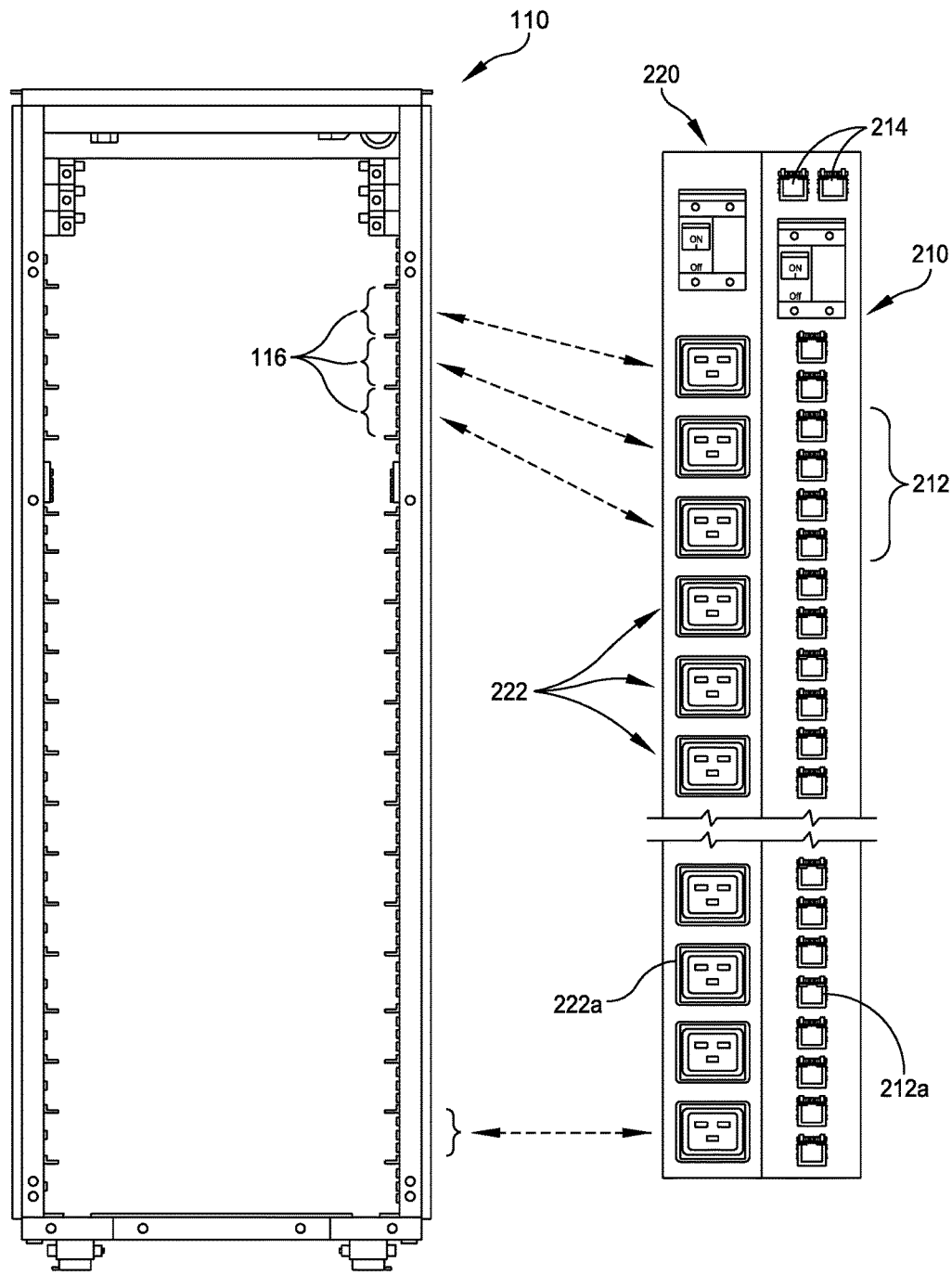
FIG. 2 is a schematic diagram of another rack level network switch in accord with at least one embodiment.

FIG. 2 illustrates another example of a network switch 210, similar to the network switch 120 of FIG. 1, in accord with at least one embodiment, and including a number of network ports 212, and optionally including one or more uplink ports 214. The network switch 210 is coupled with a power distribution unit 220 that includes a number of power outlets 222. Each of the network switch 210 and the power distribution unit 220 is physically configured to be mounted vertically, along the vertical length of the rack 110, and substantially, though not necessarily, the full height of the rack 110. Each of the network ports 212 is associated with a space 116 in the rack, similar to the example network switch 120 of FIG. 1. Additionally, each of the power outlets 222 may be associated with a space 116 in the rack 110. Alternately or additionally, each of the power outlets 222 may be associated with one or more of the network ports 212. As shown, two network ports 212 are associated with each power outlet 222. In alternate embodiments, there may be a one-to-one association between network ports and power outlets, whereby each power outlet is associated with only one network port and each network port is associated with only one power outlet. In various embodiments, multiple power outlets may be associated with a given network port, multiple network ports may be associated with a given power outlet, or any combination of such associations may be included.

In various embodiments, the network switch 210 and the power distribution unit 220 are configured such that one or more network ports 212 is associated with a space 116 in the rack 110 and such that one or more power outlets 222 is associated with a space 116 in the rack 110. Accordingly, if a piece of equipment installed in the rack 110 is coupled to a particular network port 212a (e.g., via a network cable), the piece of equipment may also be connected to power from a particular associated power outlet 222a, for example. For any given piece of equipment, multiple network ports 212 and/or multiple power outlets 222 may provide for a redundancy scheme, without detracting from the general concept that the piece of equipment is connected to at least one network port and at least one power outlet that are associated with each other, e.g., via the coupling of the network switch 210 and the power distribution unit 220, or are associated with a particular physical space 116 in the rack 110.

In some embodiments, the power distribution unit 220 may be a simple device, such as a power strip. In various embodiments, however, the power distribution unit 220 may be a "smart" device, having any of various power distribution and/or reliable power capabilities. For example, the power distribution unit 220 may be controllable to turn power on or off to individual power outlets 222. The power distribution unit 220 may be capable of detecting and/or measuring (e.g., metering) power consumption through a particular power outlet 222. The power distribution unit 220 may be capable of detecting and/or measuring (e.g., metering) total power consumption through the power distribution unit 220, e.g., of the entire rack 110. The power distribution unit 220 may include uninterruptible or backup power capabilities. Accordingly, in various embodiments, the power distribution unit 220 may be manageable and may have network communications capability. In some embodiments, the power distribution unit 220 may communicate with a central management capability via one of the uplink ports 214. Alternately or additionally, the power distribution unit 220 may be managed by a process and/or processor associated with the network switch 210.

In various embodiments, the network switch 210 may be coupled to the power distribution unit 220 in various fashions. For example, each of the network switch 210 and the power distribution unit 220 may have matching connectors on respective sides, such that the network switch 210 and the power distribution unit 220 may be physically mated together to form a unit. Such matching connectors may provide mechanical, electrical, or communications linkages, or any combination of these, as appropriate for various applications. In some embodiments, the network switch 210 and the power distribution unit 220 may be coupled together by a tethering cable. In some embodiments, the network switch 210 and the power distribution unit 220 may be configured to fit into a common space of the rack 110, such as a rear space or channel.

In some embodiments, the network switch 210 and the power distribution unit 220 may operate together physically, in that they are physically installed on the same rack 110 and serve common spaces 116, but they may not be physically coupled to each other. For example, a logical coupling of the network switch 210 and the power distribution unit 220, e.g., to associate network ports and power outlets with a particular piece of equipment, may be accomplished in part by a remote device, such as a data center management system. For instance, the network switch 210 may detect network activity on a given network port and may identify the equipment connected to the network port (as described above) and may provide such information to a data center management system. The data center management system may, with knowledge of which network port the equipment is attached, may determine in which rack space the equipment is installed (by association of the network port with a rack space). The data center management system may then also determine one or more power outlets that may be providing power to the equipment (by association of the power outlet(s) with the rack space).

In various embodiments, the network switch 210 and the power distribution unit 220 may be more tightly coupled in a logical sense. For example, the network switch 210 and the power distribution unit 220 may be configured, by suitable processing componentry, to make the same determinations as discussed above with respect to a data center management system. The determined associations of equipment identification, network port identification, rack space, power outlet, or any combination of these, may then be stored in a database or communicated to a data center management system, for example.

In the above description, identification of a rack space is described as an intermediate to associating a piece of equipment to one or more power outlets. In some embodiments, however, identification of a particular rack space may not be necessary, in that one or more power outlets may be associated with one or more network ports, without regard to which particular rack space is served by them.

Figure 3:
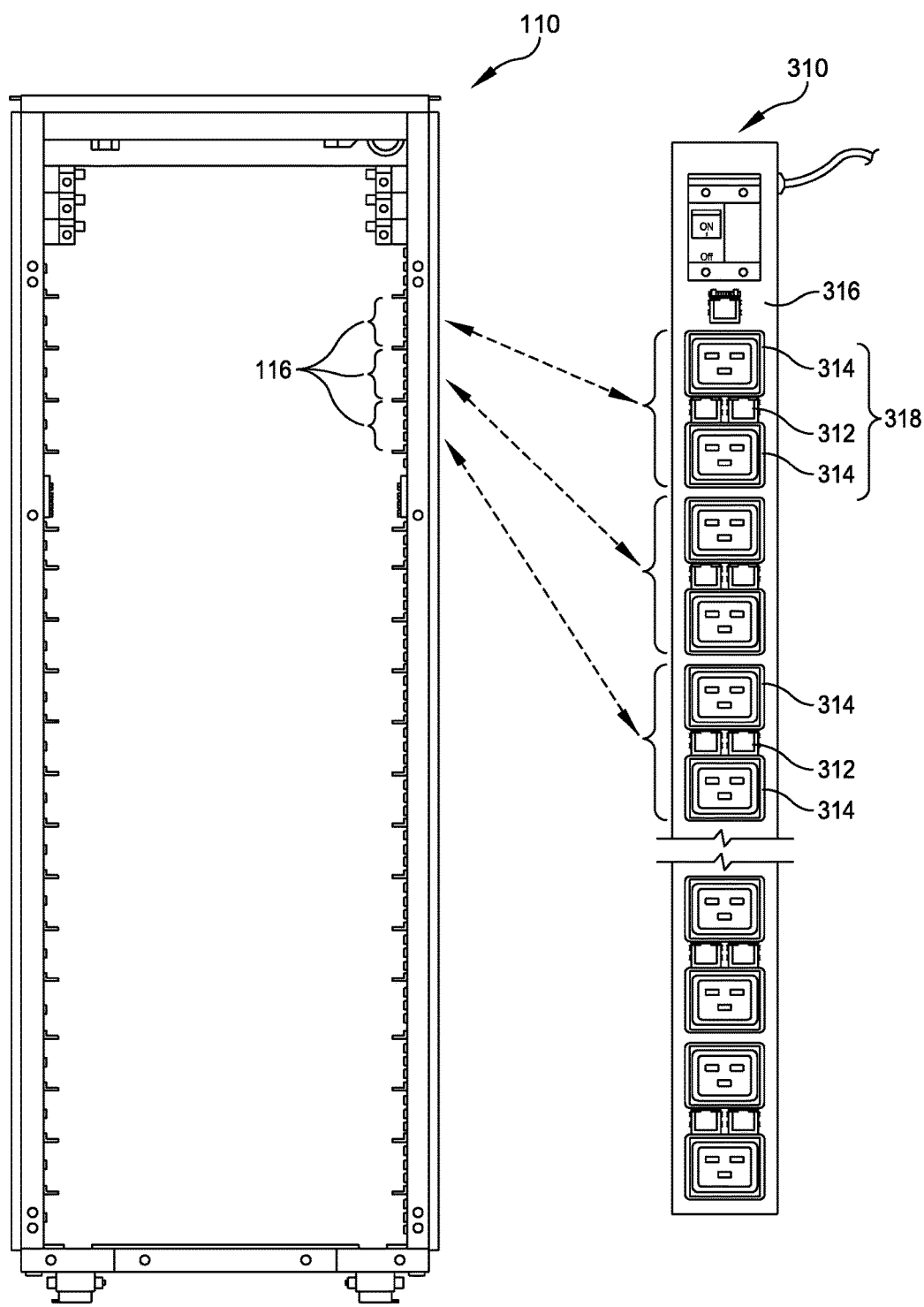
FIG. 3 is a schematic diagram of another rack level network switch in accord with at least one embodiment.

FIG. 3 illustrates another example network switch 310 in accord with aspects and embodiments described herein. The network switch 310 includes integrated power distribution capability. Accordingly, the network switch 310 is similar to a combination of the network switch 210 and the power distribution unit 220 of FIG. 2 within a single chassis. The network switch 310 includes a number of network ports 312, a number of power outlets 314, and an uplink port 316. In various embodiments, and as described above, a network switch may include more or fewer uplink ports, power outlets, or network ports. Similar to the network switches 120, 210, the network switch 310 is physically configured to be mounted vertically, along the vertical length of the rack 110, and substantially, though not necessarily, the full height of the rack 110. The network switch 310 does not require any of the spaces 116 for its physical accommodation, and may be mountable on a rear portion of the rack 110, such as a rear vertical channel of the rack 110. Similar to the network switches 120, 210, each of the network ports 312 is associated with a space 116 in the rack 110. Similar to the power distribution unit 220, each of the power outlets 314 is also associated with a space 116 in the rack 110. In some embodiments, network ports 312 and power outlets 314 may be logically associated into groups 318, the elements of which associated with each other, and each group 318 may be associated with a space 116 in the rack 110. As described above, there may be one-to-one associations of network ports, power outlets, and spaces 116, or there may be many-to-one or many-to-many associations.

Similar to the network switches 120, 210 and the power distribution unit 220 described above, the network switch 310 may detect network activity on a particular network port 312, thereby identify a piece of equipment connected to the particular network port 312, and associate the piece of equipment with one or more particular power outlets 314. Accordingly, the network switch 310 may collect information as to which pieces of equipment are powered by which power outlets, and may provide such information to other equipment, such as a data center management system. Further in some embodiments, the network switch 310 may also associate the piece of equipment with the particular space 116 in the rack 110 that is served by the particular network port 312 and/or the particular power outlet 314. Accordingly, the network switch 310 may collect information as to which pieces of equipment are installed in which racks 110 and rack spaces 116, and may provide such information to other equipment, such as a data center management system.

Accordingly, the network switch 310 and/or a data center management system may advantageously use the above described collected information to manage the equipment in a data center, to control network connectivity of the equipment, to provide out-of-band management, such as configuration and software updates, to the equipment, to power-cycle the equipment, to monitor the power consumption of the equipment, and accordingly may thereby be capable of detecting faults in the equipment or predicting failure of the equipment, or determine need for expansion of the equipment capabilities, or consolidating equipment to provide various functions, and all manner of similar or other equipment management capabilities. Collection of the above described information may all be automated, without the need for manual data entry, due to operation of network switches in accord with those described herein.

Figure 4:
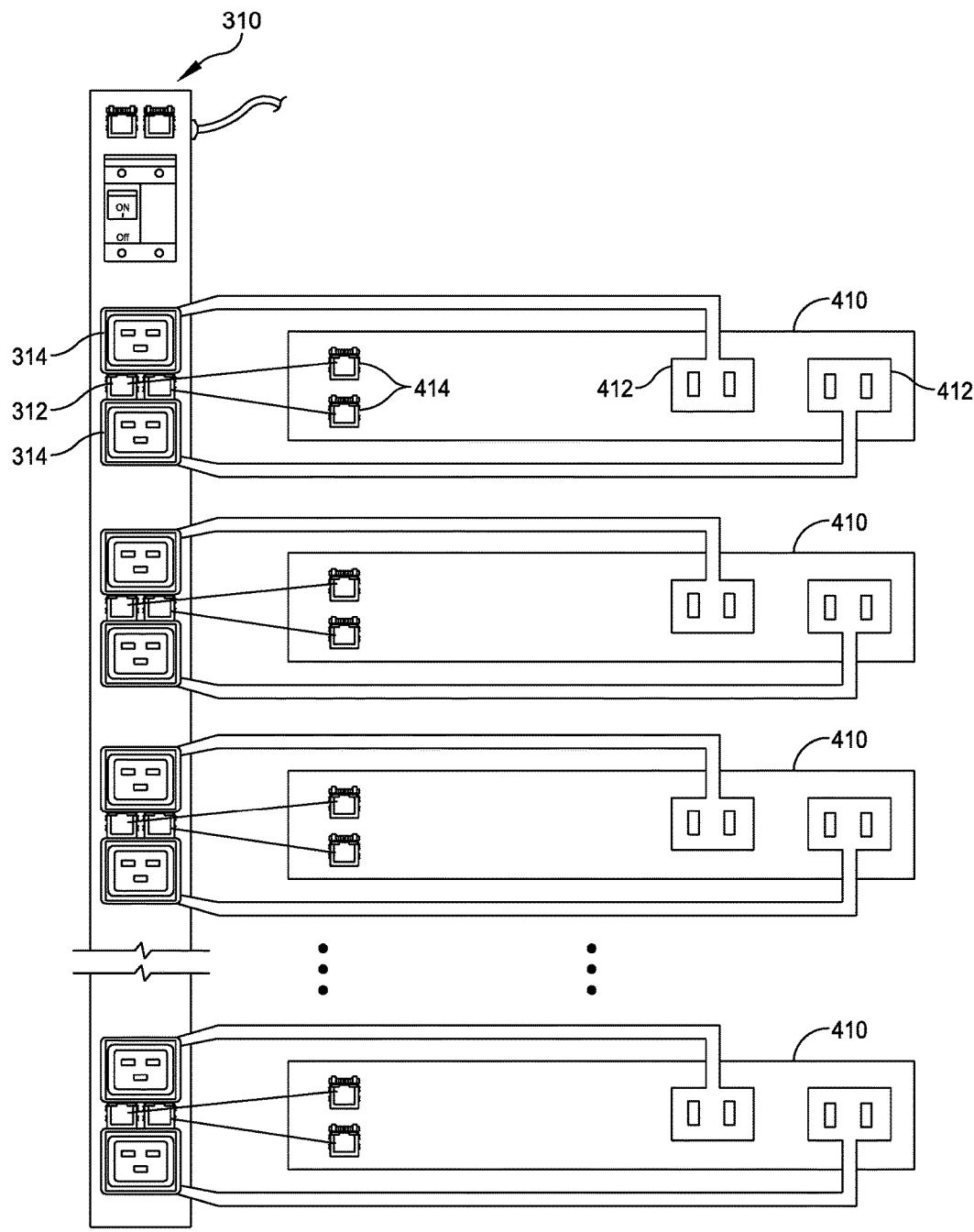
FIG. 4 is a schematic diagram of the rack level network switch of FIG. 3 shown with connected equipment.

FIG. 4 illustrates the example network switch 310 connected to equipment 410 to provide electrical power and network connectivity to the equipment 410. Each piece of the equipment 410, as shown in this example, includes a pair of power connectors 412 and a pair of network connectors 414. In other examples, various pieces of equipment may have more or fewer power and/or network connectors. Each power connector 412 is plugged into a power outlet 314 of the network switch 310, and each network connector 414 is plugged into a network port 312 of the network switch 310. When properly connected, as shown, each piece of equipment 410 is plugged into one or more power outlets 314 that is associated with at least one network port 312 into which the piece of equipment 410 is also plugged. Accordingly, the network connection(s) of each piece of equipment 410 is associated with the power connection(s) of the piece of equipment, the association being maintained by the network switch 310, physically and logically, e.g., by physical proximity in the chassis/enclosure of the network switch 310 and by logical association within a controller of the network switch 310 and/or a data center management system. In some examples, the network ports 312 and/or power outlets 314 are also physically and logically associated with a rack space in similar fashion.

Figure 5A:
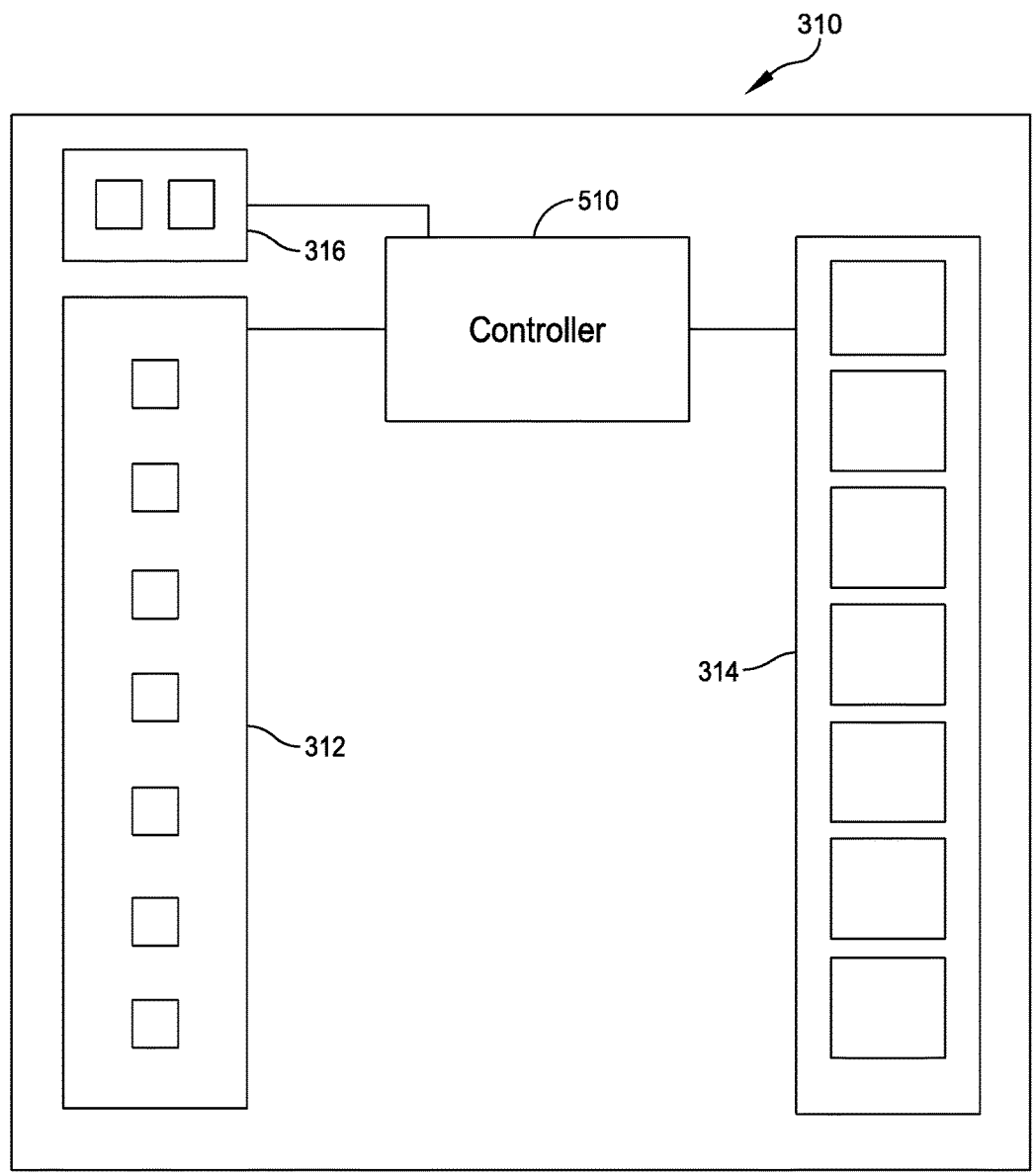
FIG. 5A is an example block diagram of the rack level network switch of any of FIGS. 2-4.

FIG. 5A illustrates a block diagram of the example network switch 310 or the example network switch 220. Each of the network ports 312, the power outlets 314, and optional uplink port(s) 316, are coupled to a controller 510. The controller 510 may provide multiple functions as previously described, including the switching or routing of network datagrams between the network ports 312 (and the uplink ports 316 in some examples), storing the association of the network ports 312 with rack spaces (e.g., with physical location of the network ports 312 along the chassis of the network switch 310), storing the association of the network ports 312 with power outlets 314, detecting and identifying the equipment connected to the network ports 312 (and associated power outlets 314), and monitoring of power delivered to one or more of the power outlets 314, for example. The controller 510 may perform additional or fewer functions in various embodiments. In some embodiments, some functions may be performed by the controller 510 in combination with a higher level computing environment, such as in combination with a data center management system, for example. In some embodiments, and as discussed above, a network switch in accord with aspects described herein may not include power outlets, such as the network switch 120 of FIG. 1, or may be associated with power outlets through a further power distribution unit, such as the case for the network switch 210 of FIG. 2. Various embodiments of each of these examples may include a controller similar to the controller 510 of FIG. 5A.

Figure 5B:
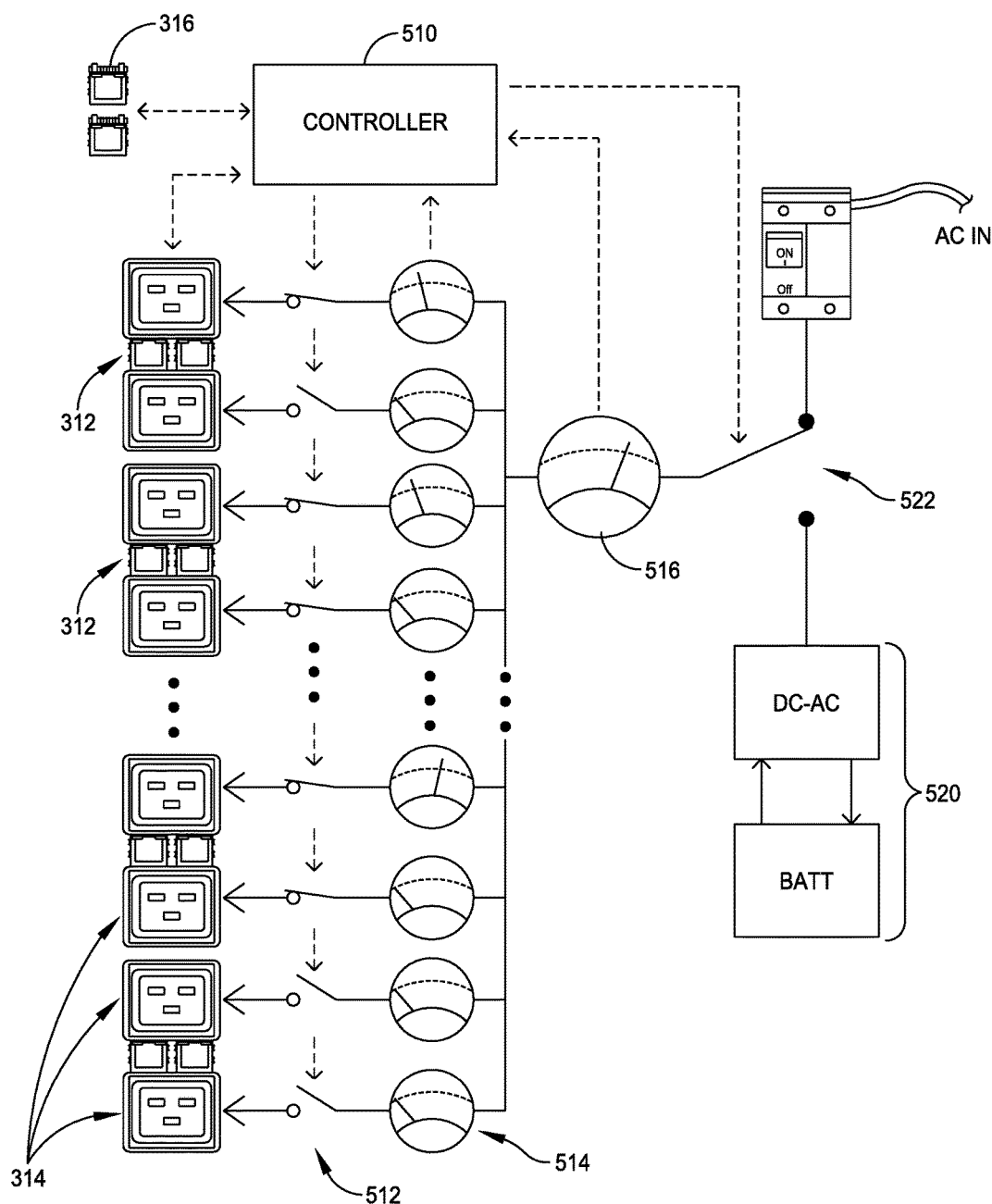
FIG. 5B is another example block diagram of the rack level network switch of any of FIGS. 2-4.

FIG. 5B illustrates a further block diagram of the example network switch 310 or the example network switch 220. In various embodiments, power distribution capabilities may include individual switching 512 of the power outlets 314, individual metering 514 of the power outlets 314, group metering 516 of the power outlets 314, and/or battery backup 520 power provision (with power switching 522). In some embodiments, additional alternate or redundant power sources may be supported. In some embodiments, some of the power outlets 314 may be group switched and/or some of the power outlets may be unswitched. Switching, metering, and network functions may all be under the control of one or more controllers (e.g., the controller 510), and such control may be distributed (e.g., a portion of the functions of the controller 510 may be performed on a remote computing platform).

Various embodiments may include any, all, or none, of the various power distribution functionalities described above. For example, in at least one embodiment, a network switch may provide network ports that are associated with rack spaces 116 but not include associated power outlets. In various cases, uplink ports may or may not be provided. In some embodiments, power outlets may be provided, with an association to rack spaces 116, as discussed above. In some embodiments, the power outlets may include metering (individual, group, or both). In some embodiments, the power outlets may include switching control such that the power outlets may be turned on or off, e.g., by a controller, with any variation or combination of individual and/or group switching control. Some of the power outlets may be provided with uninterruptible or backup power, etc.

Various embodiments provide various integration between networking functionalities and power provision functionalities. For example, identification and association of a piece of equipment with a rack space 116 may be provided via identification of network port traffic and/or power consumption at a power outlet, as described previously. In some embodiments, out-of-band management may be provided to include outlet switching to provide the capability to shut down and/or hard reboot a device. In some embodiments, out-of-band management data and/or passive network monitoring data may be compared with power outlet metering for diagnostic and/or equipment identification purposes.

Various embodiments may include control functionality beyond the equipment rack in which the network switch is associated. For example, network activity and/or power consumption within a rack may be increasing or decreasing and/or may be high or low. In some embodiments, a controller (e.g., controller 510) may identify that the computing load imposed across two racks could be handled by a single rack (e.g., by identification that each of the two racks has relatively low network activity and power consumption, for instance) and may communicate out-of-band management messages to migrate processes running on equipment within one rack to the equipment in the other rack, and to shut down the equipment in the first rack once migration is complete. Similarly, the load on a single rack may increase to exceed the capacity of the equipment in the rack, and in some embodiments a controller may detect the increasing load (e.g., via network activity, out-of-band management data, and/or power consumption) and power up the equipment in an additional rack in response thereto. Existing processes in the first rack may be migrated to the newly powered rack and/or new processes may be assigned to the newly powered rack in response to new demands. In some embodiments, a controller may detect malicious activity within the equipment in a rack and may shutdown the equipment or otherwise power off the rack, possibly including emergency hard power shut-off to prevent infection or corruption of data or other equipment.

Some embodiments include an equipment rack provided to function as an individual data center, e.g., a micro data center. For example, embodiments include an equipment rack having network switch and power distribution capabilities as described herein, along with console capabilities (such as keyboard, video, mouse, etc.), integrated appliances, such as servers and/or additional network switches or routers, temperature control (e.g., cooling), security components, backup power provisions (e.g., batteries, converters, etc.), and the like.

Figure 6:
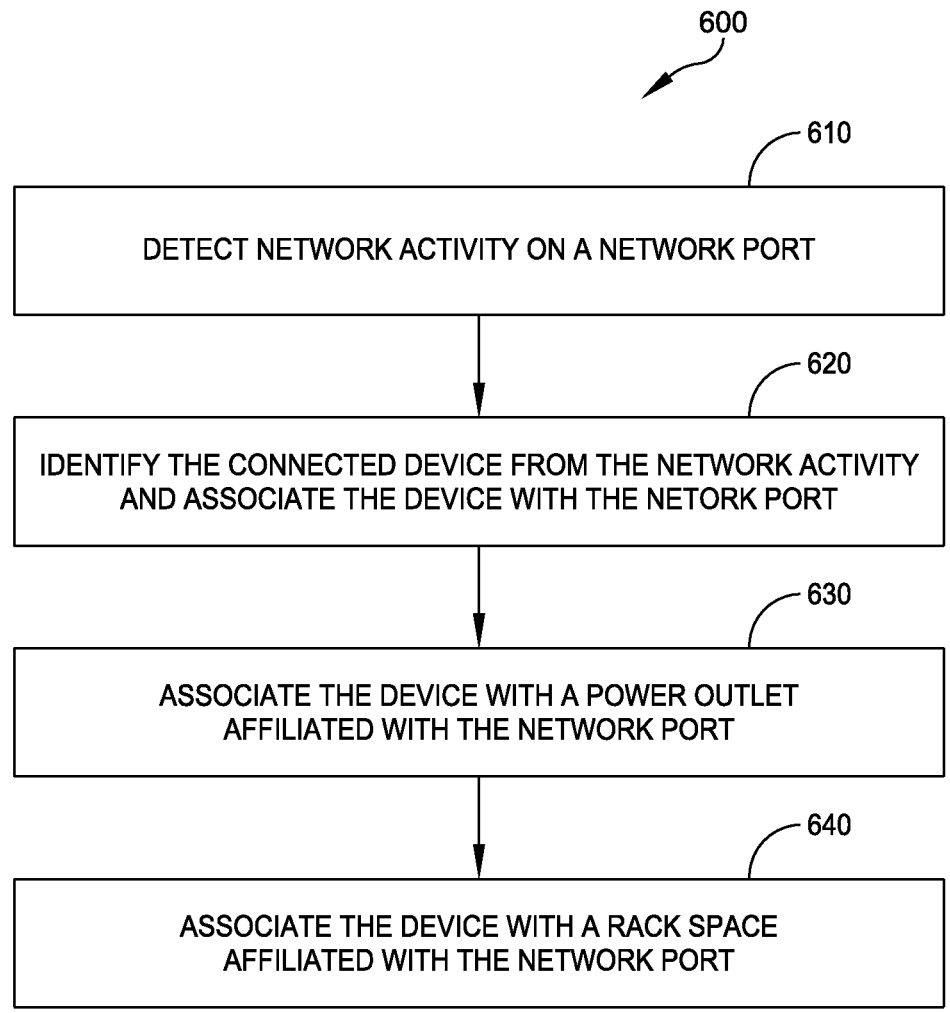
FIG. 6 is a flow diagram of a method of associating rack equipment with network port(s) and power outlet(s)

FIG. 6 illustrates a method 600 that may be implemented by a network switch in accord with aspects and embodiments described herein. In a data center environment, where various equipment is installed in racks and connected to one or more network ports associated with a rack space, and in some cases connected to one or more power outlets associated with a rack space, the method 600 includes detecting network activity on one of the network ports (block 610), identifying the connected device (e.g., the piece of equipment) and associating it with the network port (block 620). Identification of the connected device may include any of various identification techniques and/or identifiers. In some examples, a MAC address may be a suitable identifier. Various embodiments may further identify the connected device by network layer addresses. For example, either of a MAC address or a network layer address is discoverable by interpreting datagrams transmitted by the connected device. In some embodiments, a query may be made to acquire a different identifier, such as a serial number requested from the connected device, for example, or a database lookup that identifies a make, model, revision, or similar identification and/or combination of identification information.

In some embodiments, the method 600 also may associate the connected device with one or more power outlets (block 630), for example via an affiliation between the network port and various power outlet(s), as described previously. In some embodiments, the method 600 may associate the connected device with one or more rack spaces (block 640), for example via an affiliation between the network port and various rack space(s), as described previously. In some instances, association of the connected device with one or more power outlets (block 630) may be achieved via a first association with a rack space (block 640) and via an affiliation between the rack space and various power outlet(s). In some embodiments, a data center management system working in combination with a network switch may perform the method 600, or a similar method.

In some embodiments, a localized management console may be provided that works in combination with, or is enabled by, the network switch. In various embodiments, additional actions may be taken, actions may be omitted, or the actions of the example method 600 may be taken in varying order. Various embodiments of network switches (in some cases alongside and/or integrated with power distribution units) provide network ports configured to serve specific rack spaces, and may provide power outlets configured to serve specific rack spaces. Accordingly, a method such as the method 600 is enabled because an identification of a device in the rack (discovered from the device's network traffic) may therefore be associated with certain network ports, certain rack spaces, and/or certain power outlets, in an automated fashion within human interaction or manual data entry.

Various embodiments may provide further enhanced performance and/or advantageous operation. In one example, a console manager and/or data center management system, with the benefit of a network switch and power distribution unit as described herein, may identify an installed piece of equipment by model number and may retrieve information about the equipment's expected power consumption, and confirm that the associated power outlet is providing approximately the expected amount of power. Such confirmation may be used to further confirm that the correct power outlet has been associated with the equipment, or that the equipment is plugged in to the correct power outlet. Further, a console manager and/or data center management system may identify all the equipment in the rack and determine the power consumption needs of the entire rack, determine whether the power needs exceed a limit, manage which pieces of equipment are allowed to operate (in some instances), and various other management operations. As a further example, a piece of equipment may stop responding to network traffic, and a console manager and/or data center management system may detect the ceased operation and, with knowledge of the power outlet from which power is provided to the particular piece of equipment, may power cycle the piece of equipment to force it to reboot. In some examples, the console manager and/or data center management system may attempt communication with the piece of equipment on a different network port, or attempt other out-of-band management of the device, prior to or instead of forcing a power cycle and reboot.

In some embodiments, a network switch in accord with aspects and embodiments herein, optionally alongside and/or integrated with a power distribution unit, may include, or may provide service to, a user interface such as may include a display, a keyboard, a mouse, etc., for example, and which may be in the form of remote desktop and/or virtual desktop interfaces. For example, in some embodiments, a network switch in accord with those herein may include keyboard, video, and mouse (KVM) switching capabilities to support a KVM console with access to any or all pieces of equipment in the rack. In some embodiments, KVM connections may be provided to the equipment from the network switch, and access to the KVM connections may be provided to a user through a remote or virtual desktop, e.g., via network communications or other means.

In various embodiments, a network switch in accord with aspects and embodiments herein, optionally alongside and/or integrated with a power distribution unit, as described, may be provided with redundancy. For example, two network switches may be provided for a single rack. In another example, a network switch may provide two or more independent network ports associated with the same rack space, to provide redundancy. Similarly, two or more power distribution units may be included and/or a power distribution unit may provide two or more independent power outlets associated with a given rack space.

Figure 7:
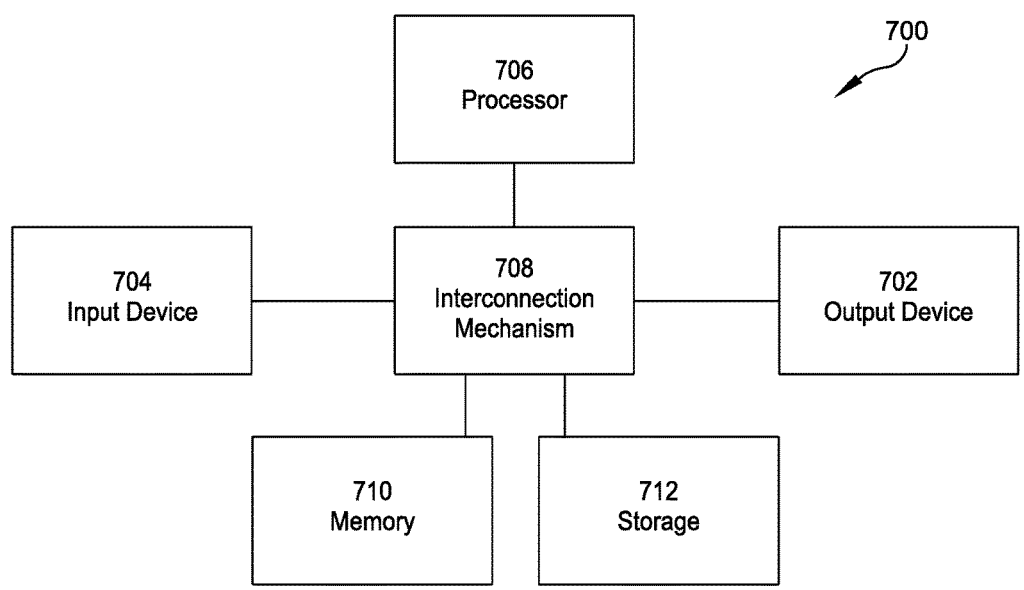
FIG. 7 is an example block diagram of computing components forming a system which may be configured to implement one or more aspects of the present invention.

FIG. 7 illustrates an example block diagram of computing components forming a computing system 700 which may be configured to implement one or more aspects disclosed herein. For example, a controller of any of the network switches and/or power distribution units (e.g., the controller 510) in accord with the aspects and examples described herein, or similar, may include a computing system 700, and may provide a management interface to an operator, or communication capability to other devices, for example.

The computing system 700 may include for example a computing platform such as those based on general computing processors, specialized processors, or microcontrollers. Computing system 700 may include specially-programmed, special-purpose hardware, for example, a network processor, an application-specific integrated circuit (ASIC), or more generally designed hardware, such as a field programmable gate array (FPGA) or a general purpose processor. Additionally, various aspects of the present disclosure may be implemented as specialized software executing on a computing system 700 such as that shown in FIG. 7.

The computing system 700 may include a processor/ASIC 706 connected to one or more memory devices 710, such as a disk drive, memory, flash memory, embedded or on-chip memory, or other device for storing data. Memory 710 may be used for storing programs and data during operation of the computing system 700. Components of the computing system 700 may be coupled by an interconnection mechanism 708, which may include one or more buses and/or a network. The interconnection mechanism 708 enables communications of, e.g., data and instructions, to be exchanged between components of the computing system 700. The computing system 700 may also include one or more input devices 704, which may include, for example, a keyboard, a mouse, a touch screen, and the like. The computing system 700 may also include one or more output devices 702, which may include, for example, a display, a buzzer, alarm, or other audio indicator, a light, or other visual indicator, and the like. In addition, the computing system 700 may contain one or more interfaces (not shown) that may connect the computing system 700 to a communication network, in addition to or as an alternative to the interconnection mechanism 708.

The computing system 700 may include a storage component 712, which may include a computer readable and/or writeable nonvolatile medium in which signals may be stored to provide a program to be executed by the processor/ASIC 706 or to provide information stored on or in the medium to be processed by the program. The medium may, for example, be a disk or flash memory or other non-volatile memory including programmable read-only memory (PROM) of various types, and in some examples may include random access memory (RAM). In some embodiments, the processor may cause data to be read from the nonvolatile medium into another memory 710 that allows for faster access to the information by the processor/ASIC 706 than does the medium. This memory 710 may be a volatile, random access memory such as a dynamic random access memory (DRAM) or static memory (SRAM). It may be located in storage component 712 or in memory 710. The processor/ASIC 706 may manipulate the data within the memory 710 and copy the data to the storage 712 after processing is completed. Either or both of the memory 710 and storage 712 may be integrated in the processor/ASIC 706.

The computing system 700 may include a computer platform that is programmable using a high-level computer programming language. The computing system 700 may also be implemented using specially programmed or special purpose hardware, e.g. an ASIC. The processor/ASIC 706 may execute a core low-level operating system and may also execute a high-level operating system.

In certain embodiments, a network switch and/or a power distribution unit may have a controller in accord with aspects and embodiments disclosed herein and the controller may include a processor, which may be any of the above or other suitable processors, including ASICs, and may run an instruction set or operate upon other logic, to implement control of the UPS components as discussed above.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A communication network switch comprising:
   an elongated enclosure physically configured to be aligned along the height of an equipment rack;
   at least three network ports aligned along a longitudinal axis of the enclosure such that each of the at least three network ports is substantially physically associated with at least one of a plurality of mounting spaces within the equipment rack; and
   a controller coupled to the at least three network ports and configured to detect an identifier of a piece of equipment connected to an identified one of the at least three network ports.

2. The network switch of claim 1 further comprising one or more uplink ports, the controller being further configured to provide communications between the at least three network ports and the uplink ports.

3. The network switch of claim 2 wherein the controller is further configured to communicate the identifier to a remote system via the one or more uplink ports.

4. The network switch of claim 2 further comprising at least three power outlets aligned along the longitudinal axis of the enclosure such that each of the at least three network ports is substantially physically associated with at least one of the at least three power outlets.

5. The network switch of claim 4 wherein the controller is further configured to identify a piece of equipment connected to an identified one of the at least three network ports and to associate at least one of the at least three power outlets with the piece of equipment based upon the physical association of the at least one of the at least three power outlets with the identified network port.

6. The network switch of claim 1 further comprising at least three power outlets aligned along the longitudinal axis of the enclosure such that each of the at least three power outlets is substantially physically associated with at least one of the plurality of mounting spaces.

7. The network switch of claim 1 further comprising the equipment rack.

8. The network switch of claim 1, wherein the controller is further configured to identify at least one of the plurality of mounting spaces as being associated with the piece of equipment based upon the physical association of the at least one of the plurality of mounting spaces with the at least one of the at least three network ports.

9. A communication network switch comprising:
    at least three network ports;
    at least three power connections;
    a chassis physically configured to substantially align along a height of an equipment rack, wherein the at least three network ports are aligned along a longitudinal axis of the chassis; and
    a controller coupled to the at least three network ports, wherein the controller is configured to provide communications between the at least three network ports and to logically associate each of the at least three power connections with at least one of the at least three network ports.

10. The network switch of claim 9 wherein the controller is further configured to identify a piece of equipment connected to at least one of the at least three network ports based upon network traffic on the at least one of the at least three network ports.

11. The network switch of claim 10 wherein the controller is further configured to identify at least one of the at least three power connections as providing power to the piece of equipment based upon the logical association of each of the at least three power connections with the at least one of the at least three network ports.

12. The network switch of claim 9 wherein each of the at least three network ports is physically associated with at least one of the at least three power connections.

13. The network switch of claim 9, wherein the at least three network ports are aligned along a longitudinal axis of the chassis such that each of the at least three network ports is substantially physically associated with at least one of a plurality of mounting spaces within the equipment rack when the chassis is installed to the equipment rack.

14. The network switch of claim 13 wherein the controller is further configured to identify a piece of equipment connected to at least one of the at least three network ports based upon network traffic on the at least one of the at least three network ports and to identify at least one of the plurality of mounting spaces as being associated with the piece of equipment based upon the physical association of the at least one of the plurality of mounting spaces with the at least one of the at least three network ports.

15. The network switch of claim 13, wherein the at least three power connections are aligned along the longitudinal axis of the chassis such that each of the at least three power connections is substantially physically associated with at least one of the plurality of mounting spaces when the chassis is installed to the equipment rack.

16. A method of managing equipment mounted in a rack, the method comprising:
    detecting network activity on a network port;
    identifying the equipment from the network activity;
    associating the equipment with the network port; and
    associating the equipment with at least one of a rack space and a power outlet based upon an affiliation of the at least one rack space or power outlet with the network port.

17. The method of claim 16 further comprising communicating to a remote device an identifier of the equipment, the network port, and the at least one rack space or power outlet.

18. The method of claim 16 further comprising identifying an associated power outlet based upon an affiliation of the associated power outlet with the network port and detecting an amount of power provided via the associated power outlet.

19. The method of claim 18 further comprising determining an expected power consumption of the equipment based upon the identification of the equipment.

20. The method of claim 19 further comprising detecting a potential wiring fault based upon a comparison of the expected power consumption to the detected amount of power.

21. The method of claim 16 further comprising identifying an associated rack space based upon an affiliation of the associated rack space with the network port and populating a database to indicate that the equipment is installed in the associated rack space.

* * * * *